United States Patent
Yoon

(10) Patent No.: US 8,429,370 B2
(45) Date of Patent: Apr. 23, 2013

(54) SEMICONDUCTOR MEMORY, MEMORY SYSTEM, AND METHOD OF CONTROLLING THE SAME

(75) Inventor: Sang Sic Yoon, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 520 days.

(21) Appl. No.: 12/650,690

(22) Filed: Dec. 31, 2009

(65) Prior Publication Data

US 2011/0107051 A1    May 5, 2011

(30) Foreign Application Priority Data

Oct. 29, 2009   (KR) ................. 10-2009-0103579

(51) Int. Cl.
*G06F 12/00*    (2006.01)

(52) U.S. Cl.
USPC ............. 711/170; 711/156; 711/E12.001

(58) Field of Classification Search ............ 711/156, 711/170, E12.001
See application file for complete search history.

(56) References Cited

U.S. PATENT DOCUMENTS

| | | | | |
|---|---|---|---|---|
| 5,297,268 | A * | 3/1994 | Lee et al. ................. | 711/164 |
| 5,523,859 | A * | 6/1996 | Nakajima et al. ........ | 358/444 |
| 2008/0188197 | A1 | 8/2008 | Toth et al. | |
| 2008/0305761 | A9 | 12/2008 | Toth et al. | |
| 2009/0157637 | A1* | 6/2009 | Kii et al. ................. | 707/3 |

FOREIGN PATENT DOCUMENTS

| | | |
|---|---|---|
| JP | 09-282254 | 10/1997 |
| KR | 1020080014904 A | 2/2008 |
| KR | 10-0910944 | 7/2009 |

\* cited by examiner

*Primary Examiner* — Edward Dudek, Jr.
*Assistant Examiner* — John P Fishburn
(74) *Attorney, Agent, or Firm* — William Park & Associates Ltd.

(57) ABSTRACT

Various embodiments of a semiconductor system, a semiconductor memory, and a method of controlling the same are disclosed. In one exemplary embodiment, the semiconductor memory may include a first circuit area configured to perform an operation corresponding to a general operation command and a second circuit area configured to provide the general operation command to the first circuit area. The second circuit area may be configured to determine whether the semiconductor memory is selected to perform the operation based on unique identification information and target identification information allocated to the semiconductor memory.

13 Claims, 7 Drawing Sheets

FIG.2

|  | DQ7 | DQ6 | DQ5 | DQ4 | DQ3 | DQ2 | DQ1 | DQ0 |
|---|---|---|---|---|---|---|---|---|
| Memory Chip0 | 1 | 1 | 1 | 1 | 1 | 1 | 1 | 0 |
| Memory Chip1 | 1 | 1 | 1 | 1 | 1 | 1 | 0 | 1 |
| Memory Chip2 | 1 | 1 | 1 | 1 | 1 | 0 | 1 | 1 |
| Memory Chip3 | 1 | 1 | 1 | 1 | 0 | 1 | 1 | 1 |
| Memory Chip4 | 1 | 1 | 1 | 0 | 1 | 1 | 1 | 1 |
| Memory Chip5 | 1 | 1 | 0 | 1 | 1 | 1 | 1 | 1 |
| Memory Chip6 | 1 | 0 | 1 | 1 | 1 | 1 | 1 | 1 |
| Memory Chip7 | 0 | 1 | 1 | 1 | 1 | 1 | 1 | 1 |

SEMICONDUCTOR MEMORY, MEMORY SYSTEM, AND METHOD OF CONTROLLING THE SAME

CROSS-REFERENCE TO RELATED APPLICATION

The present application claims priority under 35 U.S.C. §119(a) to Korean Patent Application No. 10-2009-0103579, filed on Oct. 29, 2009, in the Korean Intellectual Property Office, which is incorporated herein by reference in its entirety as if set forth in full.

BACKGROUND

1. Technical Field

Various embodiments of the present invention relate to semiconductor apparatuses and related methods. In particular, certain embodiments relate to a semiconductor memory, a memory system, and a method of controlling the same.

2. Related Art

A memory system may be configured in such a manner that a memory controller, such as a central processing unit (CPU) or a graphic processing unit (GPU), can control a plurality of memories. To control a plurality of memories, according to one method, the memory system allocates a channel for each memory and provides an independent command and an address signal to each memory through the corresponding allocated channel. However, allocating a channel to each memory has a disadvantage of increasing the number of channels and may be difficult to apply to an actual memory system.

SUMMARY

Accordingly, there is a need for an improved memory system that can efficiently control a plurality of semiconductor memories.

To attain the advantages and in accordance with the purposes of the invention, as embodied and broadly described herein, one exemplary aspect of the present invention may provide a semiconductor memory comprising a first circuit area configured to perform an operation corresponding to a general operation command and a second circuit area configured to provide the general operation command to the first circuit area. The general operation command may be provided from outside of the second circuit area. The second circuit area may be configured to determine whether the semiconductor memory is selected to perform the operation based on unique identification information and target identification information allocated to the semiconductor memory.

In another exemplary aspect of the present invention, a memory system may include a memory controller configured to generate an identification information store command, an identification information check command, a general operation command, unique identification information, and target identification predetermined timings. The memory system may further include a plurality of semiconductor memories, each semiconductor memory being configured to store the unique identification information in response to the identification information store command and check whether the semiconductor memory is selected based on the target identification information and the unique identification information in response to the identification information check command. Each semiconductor memory may be further configured to perform an operation corresponding to the general operation command depending on the check result (e.g., whether or not the semiconductor is selected).

According to still another exemplary aspect of the invention, a semiconductor memory may include a first circuit area configured to perform an operation corresponding to an operation command and a second circuit area configured to use unique identification information and target identification information to check whether or not the semiconductor memory is selected for the operation and provide the operation command to the first circuit area depending on the check result. The operation command uses some of all bits of an address signal related to the operation command. In some exemplary aspects, the first circuit area may be configured to directly receive a second operation command excluding the operation command through a command channel.

Another exemplary aspect of the invention may provide a memory system including a memory controller configured to output an identification information store command, general operation commands comprising a first operation command and a second operation command, unique identification information, and target identification information (e.g., at predetermined timings). The memory system may also include a plurality of semiconductor memories, where each semiconductor memory is configured to store the unique identification information in response to the identification information store command and check whether the semiconductor memory is selected based on the unique identification information and the target identification information in response to the first operation command (e.g., among the general operation commands), and perform an operation corresponding to the first operation command depending on the check result. The first operation command may use some of all bits of an address signal related to the first operation command.

In another exemplary aspect, a method of controlling a method system comprising a plurality of semiconductor memories is provided. The method may include generating an identification information store command and allocating unique identification information to the plurality of semiconductor memories, generating an identification information check command and selecting one or more of the plurality of semiconductor memories, and generating a general operation command and commonly providing the general command to the plurality of semiconductor memories, after generating the identification information check command. In various exemplary aspects, at least generating the identification information store command and generating an identification information check command is performed by a memory controller controlling the plurality of semiconductor memories.

According to still another exemplary aspect, a method of controlling a memory system comprising a plurality of semiconductor memories may include generating an identification information store command and allocating unique identification information to the plurality of semiconductor memories and commonly providing a preset operation command to the plurality of semiconductor memories, and selecting one or more of the semiconductor memories using an address signal generated in accordance with the preset operation command.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

FIG. 2 is an exemplary mapping table showing the identification information with respect to a plurality of memory chips and a plurality of data channel.

DETAILED DESCRIPTION

Figure 1:
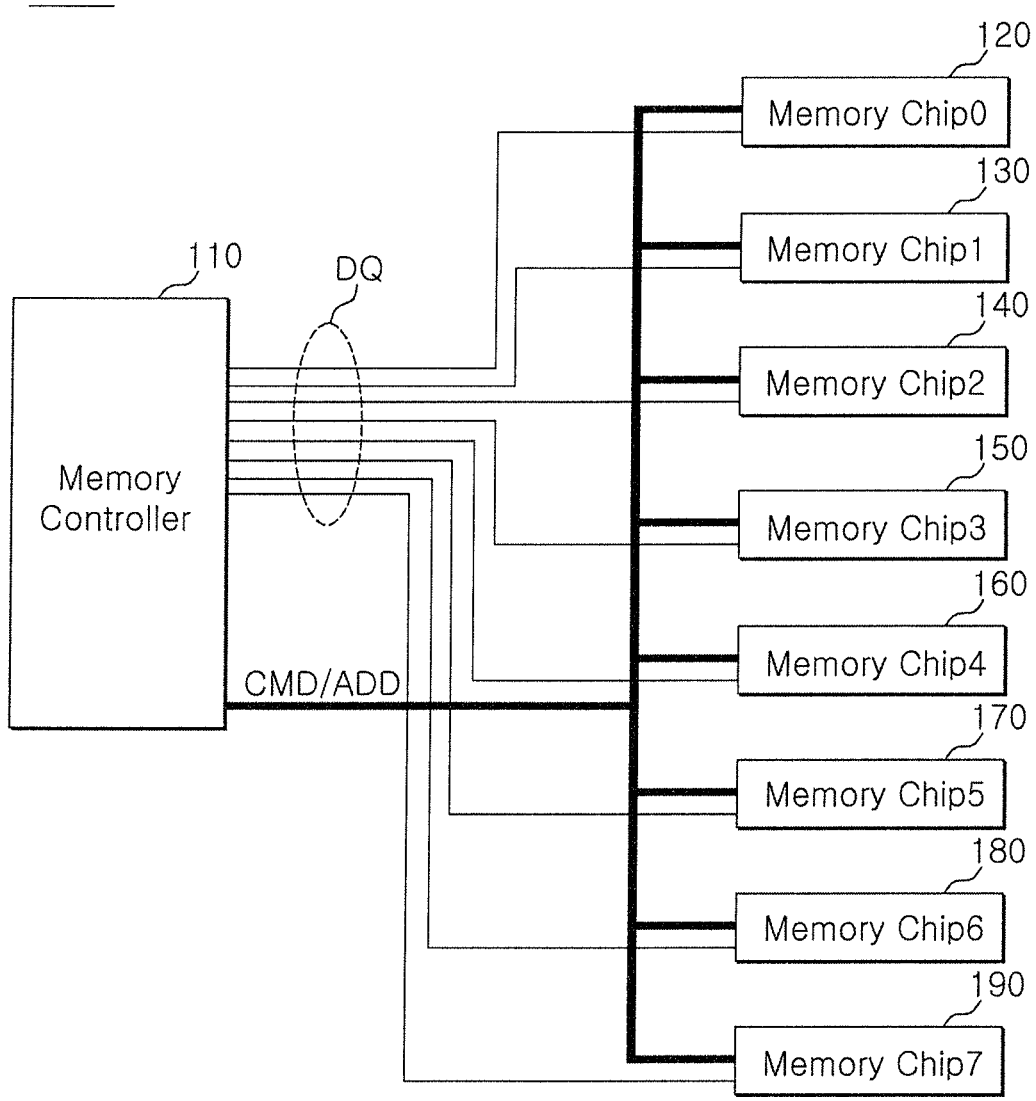
FIG. 1 is a block diagram of a memory system according to one exemplary embodiment.

Reference will now be made in detail to the exemplary embodiments consistent with the present disclosure, examples of which are illustrated in the accompanying drawings. Wherever possible, the same reference characters will be used throughout the drawings to refer to the same or like parts.

FIG. 1 is a block diagram schematically illustrating an exemplary configuration of a memory system that is consistent with various exemplary aspects of the present disclosure. As shown in FIG. 1, a memory system 100 may include a memory controller 110 and a plurality of memory chips 120 through 190. Memory system 100 may also include a plurality of data channels DQ for individually and independently transferring data between memory controller 110 and each of memory chips 120 through 190. Memory system 100 may further include a command and/or address channel CMD/ADD for commonly transferring a command signal and/or an address signal between memory controller 110 and each of memory chips 120 through 190.

According to one exemplary aspect, memory system 100 may be configured to assign unique identification information in the plurality of memory chips 120 through 190 so as to selectively operate one or more of the plurality of memory chips 120 through 190.

By way of example, FIG. 2 illustrates mapping of the identification information with respect to the plurality of memory chips 120 through 190 and data channels DQ, and the unique identification information may be assigned according to the configuration shown in FIG. 2. By differently setting the position of a bit having a value of "0" in the unique identification information, the respective memory chips 120 through 190 may have unique identification information.

As will be described further herein, memory controller 110 may be configured to provide the unique identification information to the plurality of memory chips 120 through 190 through the data channels DQ<0:7> mapped according to FIG. 2.

Memory controller 110 may be configured to provide each memory chip with an identification information store command for informing the transfer of a unique identification information to the memory chip and an identification information check command for checking whether the respective memory chip is selected or not.

The plurality of memory chips 120 through 190 are configured to store data transferred through data channels DQ<0:7> as the unique identification information.

The plurality of memory chips 120 through 190 may have configurations difference from one another depending on the types of the memory chips. However, the main components for attaining various aspects of the present disclosure have the same configuration. Accordingly, memory chip 120 is selected from the plurality of memory chips 120 through 190 as an example and its configuration will be described herein in more detail with reference to FIGS. 3 through 5.

Figure 3:
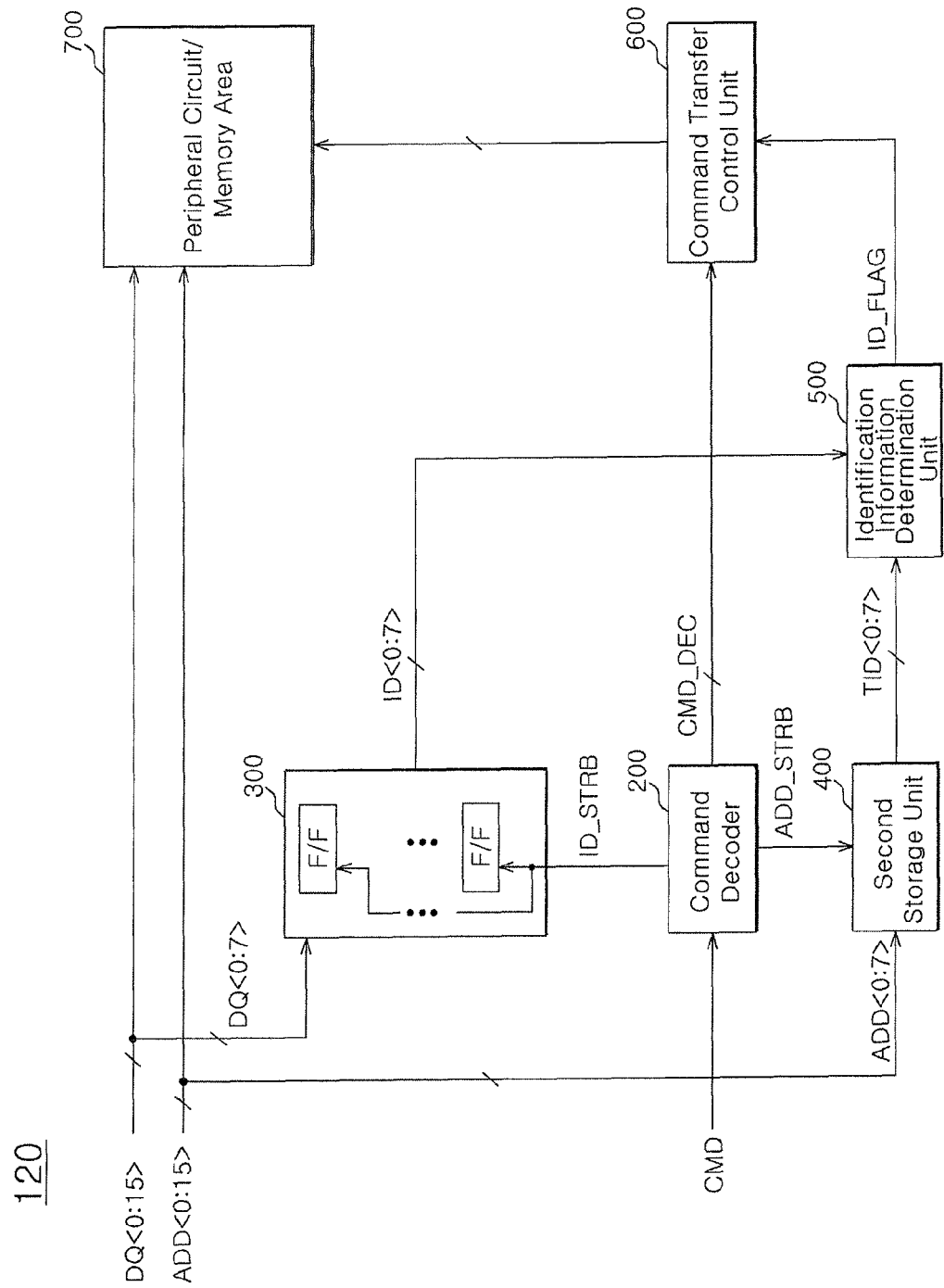
FIG. 3 is an exemplary internal block diagram for one of the memory chips shown in FIG. 1.

Referring to FIG. 3, memory chip 120 may be divided into a first circuit area and a second circuit area. The first circuit area may include a peripheral circuit/memory area 700. The second circuit area may include a command decoder 200, a first storage unit 300, a second storage unit 400, an identification information determination unit 500, and a command transfer control unit 600.

Command decoder 200 is configured to generate a decoded command CMD_DEC, a first strobe signal ID_STRB, and a second strobe signal ADD_STRB. Decoded command CMD_DEC may be obtained by decoding a command inputted through command channel CMD from memory controller 110. As will be described further herein, decoded command CMD_DEC may include, for example, an active command ACT, a pre-charge command PCG, a refresh command REF, a read command RD, a write command WT or the like.

When the inputted command is an identification information store command, command decoder 200 generates first strobe signal ID_STRB. On the other hand, when the inputted command is an identification information check command, command decoder 200 generates second strobe signal ADD_STRB.

First storage unit 300 is configured to store data transferred through data channel DQ<0:7> as unique identification information ID<0:7> in response to first strobe signal ID_STRB. First storage unit 300 may include a plurality of flip-flops F/F configured to store the data transferred through data channels DQ<0:7> by the unit of bit.

Second storage unit 400 is configured to store an address signal transferred through address channel ADD<0:7> as target identification information TID<0:7> in response to second strobe signal ADD_STRB. Memory controller 110 uses target identification information TID<0:7> to select one or more memory chips in which an operation in accordance with a command transferred through the command channel CMD is desired to be performed.

Identification information determination unit 500 is configured to generate an identification information confirm signal ID_FLAG using target identification information TID<0:7> from second storage unit 400 and unique identification information ID<0:7> from first storage unit 300.

Identification information determination unit 500 may include a multiplexer and may be configured to select target identification information TID<0> corresponding to the same sequence as unique identification information having a value of "0" (for example, ID<0>) and output the selected information as an identification information confirm signal ID_FLAG.

Identification information determination unit 500 may further include a latch for storing identification information confirm signal ID_FLAG.

Command transfer control unit 600 is configured to provide decoded command CMD_DEC to peripheral circuit/ memory area 700 in response to the activated identification information confirm signal ID_FLAG.

Peripheral circuit/memory area 700 is configured to receive data DQ<0:15>, addresses ADD<0:15>, and decoded command CMD_DEC and perform an active operation, a pre-charge operation, a refresh operation, a read or write operation, or the like in accordance with decoded command CMD_DEC.

In memory system 100 consistent with the present disclosure, memory controller 110 provides the mapped unique identification information to the plurality of memory chips 120 through 190 such that unique identification information ID<0:7> can be set in the respective memory chips 120 through 190.

Figure 4:
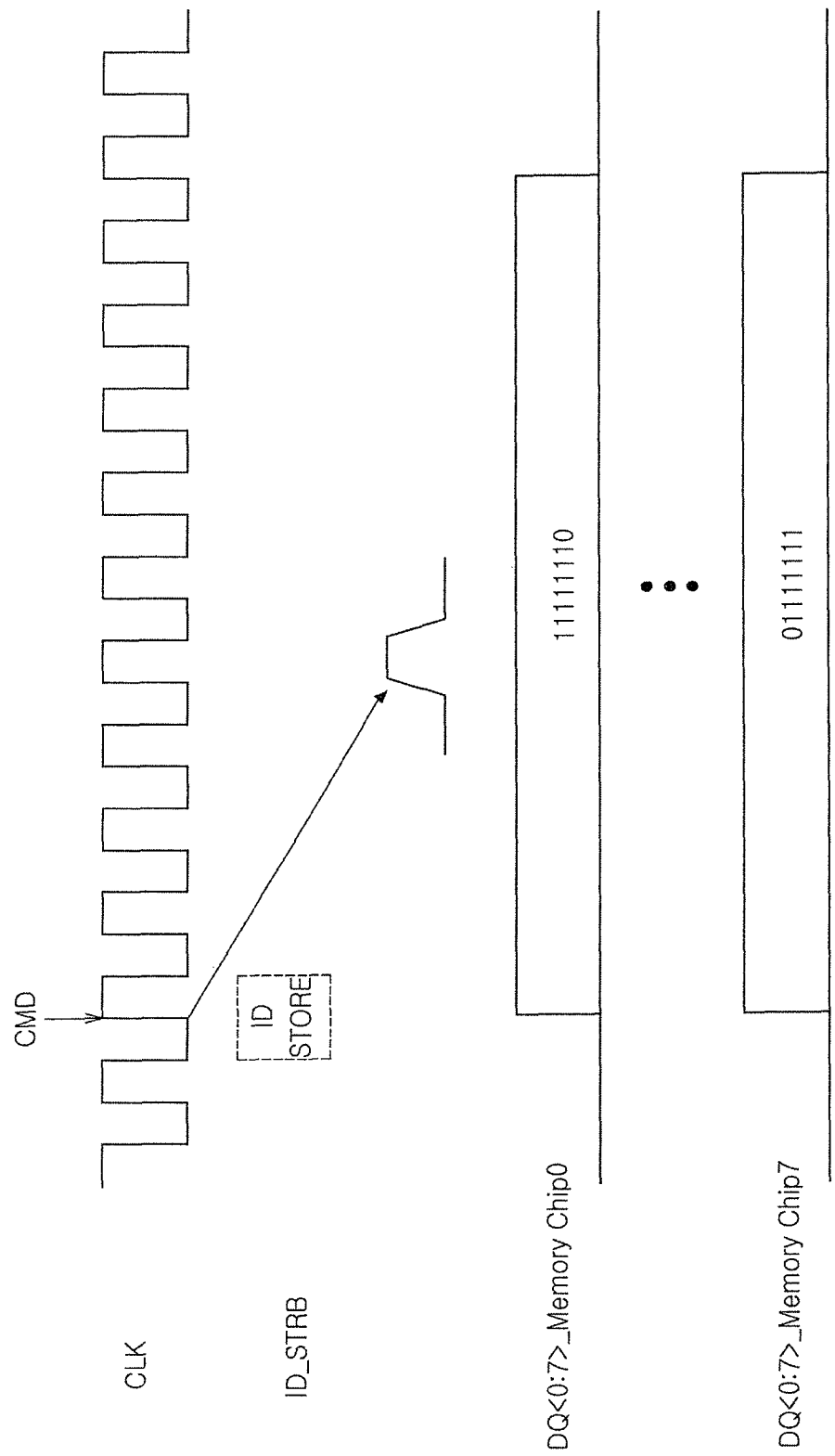
FIG. 4 is a timing diagram schematically illustrating an exemplary method of storing an identification information according to one embodiment.

Referring to FIG. 4, memory controller 110 may commonly provide an identification information store command ID STORE to the plurality of memory chips 120 through 190 through command channel CMD.

Memory controller 110 provides data having the same values as the unique identification information mapped as illustrated in FIG. 2 to respective memory chips 120 through 190 through independent data channels DQ<0:7>.

Command decoder 200 of each of memory chips 120 through 190 generates first strobe signal ID_STRB in response to identification information store command ID STORE.

First storage unit 300 is configured to store the data transferred through data channel DQ<0:7> as unique identification information ID<0:7> in response to first strobe signal ID_STRB.

As described above, the series of operations in which unique identification information ID<0:7> is set in respective memory chips 120 through 190 may be performed in an initialization operation interval of memory system 100.

Figure 5:
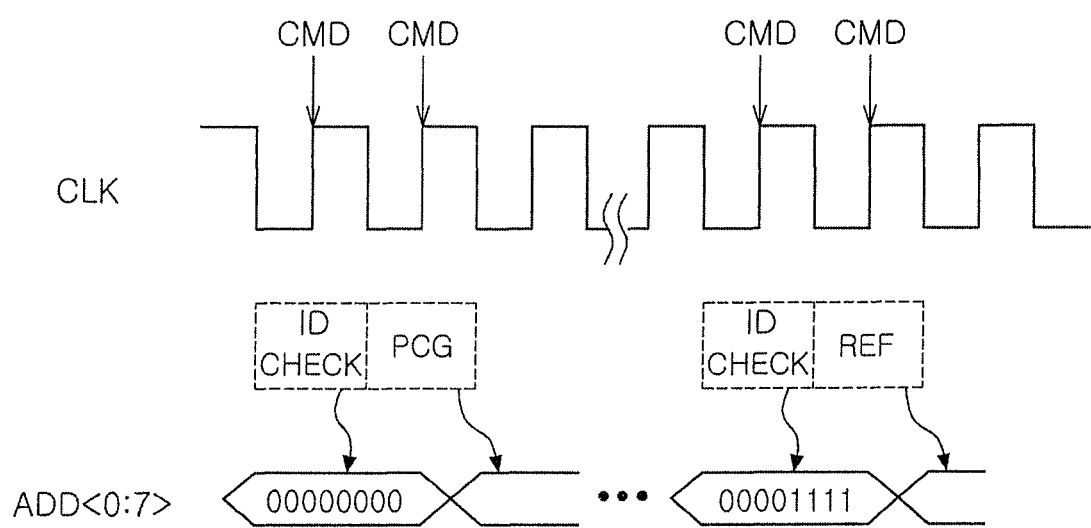
FIG. 5 is a timing diagram schematically illustrating an exemplary method of selecting a memory chip.

Then, referring to FIG. 5, memory controller 110 commonly provides an identification information check command ID CHECK for selecting one or more of the plurality of memory chips 120 through 190 through command channel CMD to memory chips 120 through 190 before outputting a general operation command.

Memory controller 110 commonly provides an address signal having the same value as the target identification information TID through the address channel ADD<0:7> to the plurality of memory chips 120 through 190.

Command decoder 200 of each of memory chips 120 through 190 generates second strobe signal ADD_STRB in response to identification information check command ID CHECK.

Second storage unit 400 stores the address signal transferred through address channel ADD<0:7> as target identification information TID<0:7> in response to second strobe signal ADD_STRB.

Identification information determination unit 500 selects target identification information TID<0> corresponding to the same sequence as unique identification information (for example, ID<0>) having a value of "0", and outputs the selected information as identification information confirm signal ID_FLAG.

Since unique identification information ID<0> of memory chip 120 is set to "0" (see FIG. 2) and target identification information TID<0> is "0", identification information determination unit 500 activates and outputs identification information confirm signal ID_FLAG.

As illustrated in FIG. 5, when target identification information TID<0:7>—i.e., an address signal transferred through the address channel ADD<0:7>—indicates "00000000," it means that memory controller 110 selected all the memory chips 120 through 190. Therefore, all the memory chips 120 through 190 may activate and output identification information confirm signal ID_FLAG.

Memory controller 110 provides a general operation command followed by identification information check command ID CHECK, for example, a pre-charge command PCG to the plurality of memory chips 120 through 190.

Command transfer control unit 600 provides decoded command CMC_DEC—i.e., pre-charge command PCG—to peripheral circuit/memory area 700 in response to activated identification information confirm signal ID_FLAG. Therefore, all memory chips 120 through 190 may perform a pre-charge operation.

On the other hand, when target identification information TID<0:7>—i.e., the address signal transferred through the address channel ADD<0:7>—indicates "00001111," it means that memory controller 110 selects memory chips 120 through 150 from the plurality of memory chips 120 through 190. Consequently, memory chips 120 through 150, among the plurality of memory chips 120 through 190, activate and output identification information confirm signal ID_FLAG.

Memory controller 110 provides a general operation command followed by identification information check command ID CHECK, for example, a refresh command REF to the plurality of memory chips 120 through 190.

Command transfer control unit 600 provides decoded command CMD_DEC—i.e., refresh command REF—to peripheral circuit/memory area 700 in response to activated identification information confirm signal ID_FLAG.

Therefore, although refresh command REF is commonly provided to the plurality of memory chips 120 through 190, only memory chips 120 through 150 perform a refresh operation.

Figure 6:
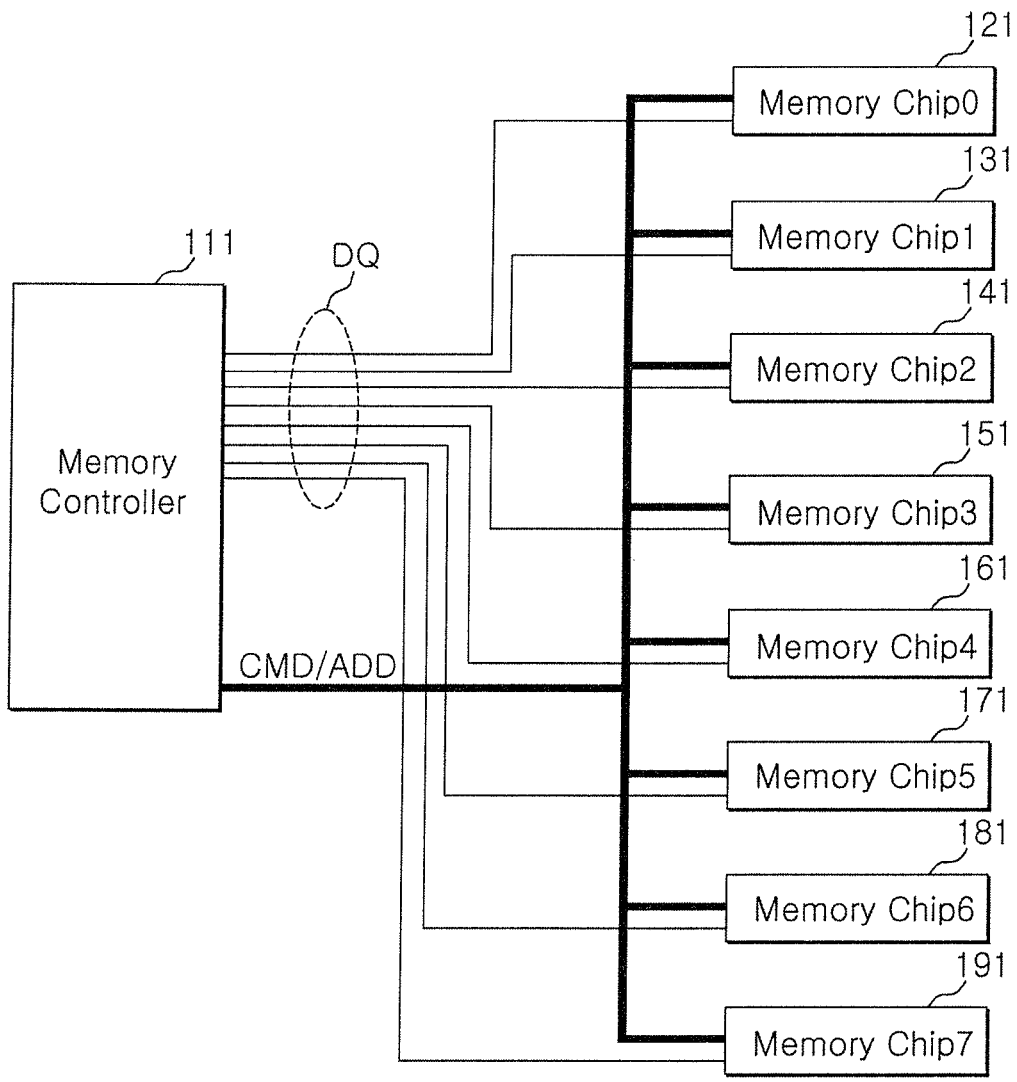
FIG. 6 is a block diagram of a memory system according to another embodiment.

FIG. 6 illustrates a block diagram of a memory system 101 according to another exemplary embodiment consistent with the present disclosure. As shown, memory system 101 may include a memory controller 111 and a plurality of memory chips 121 through 191.

Memory system 101 may include a plurality of data channels DQ for separately and independently transferring data between memory controller 111 and each of memory chips 121 through 191. Memory system 101 may further include a command and/or address channel CMD/ADD for commonly transferring command signal and/or an address signal between memory controller 111 and each of memory chips 121 through 191.

Memory system 101 of FIG. 6 can assign unique identification information in the respective memory chips 121 through 191 in substantially the same manner as memory system 100 of FIG. 1 does.

However, memory system 101 may be different from memory system 100 of FIG. 1 in that an identification information check command ID CHECK is not used, but instead target identification information TID is included in an address signal provided together with a general operation command. Since target identification information TID is included in an address signal together with a general operation command, identification information check command ID CHECK need not be used.

For example, among operation commands, an auto-refresh command AREF uses only some of all bits of an address signal. At this time, the number of bits not used by auto-refresh command AREF among all the bits of the address signal should be equal to or larger than the number of bits required for the unique identification information.

Therefore, memory controller 111 transfers an address signal to the plurality of memory chips 121 through 191, where the address signal includes target identification information TID in some bits of the address signal that are not used by an operation command.

Memory controller 111 is configured to provide an identification information store command ID STORE for informing the transfer of unique identification information to the plurality of memory chips 121 through 191.

At this time, the unique identification information may be mapped in the same manner as illustrated in FIG. 2.

The plurality of memory chips 121 through 191 may have configurations difference from one another depending on the types of the memory chips. However, the main components for attaining various aspects of the present disclosure have the same configuration. Accordingly, memory chip 121 is selected from the plurality of memory chips 121 through 191 as an example and its configuration will be described herein with reference to FIG. 7.

Figure 7:
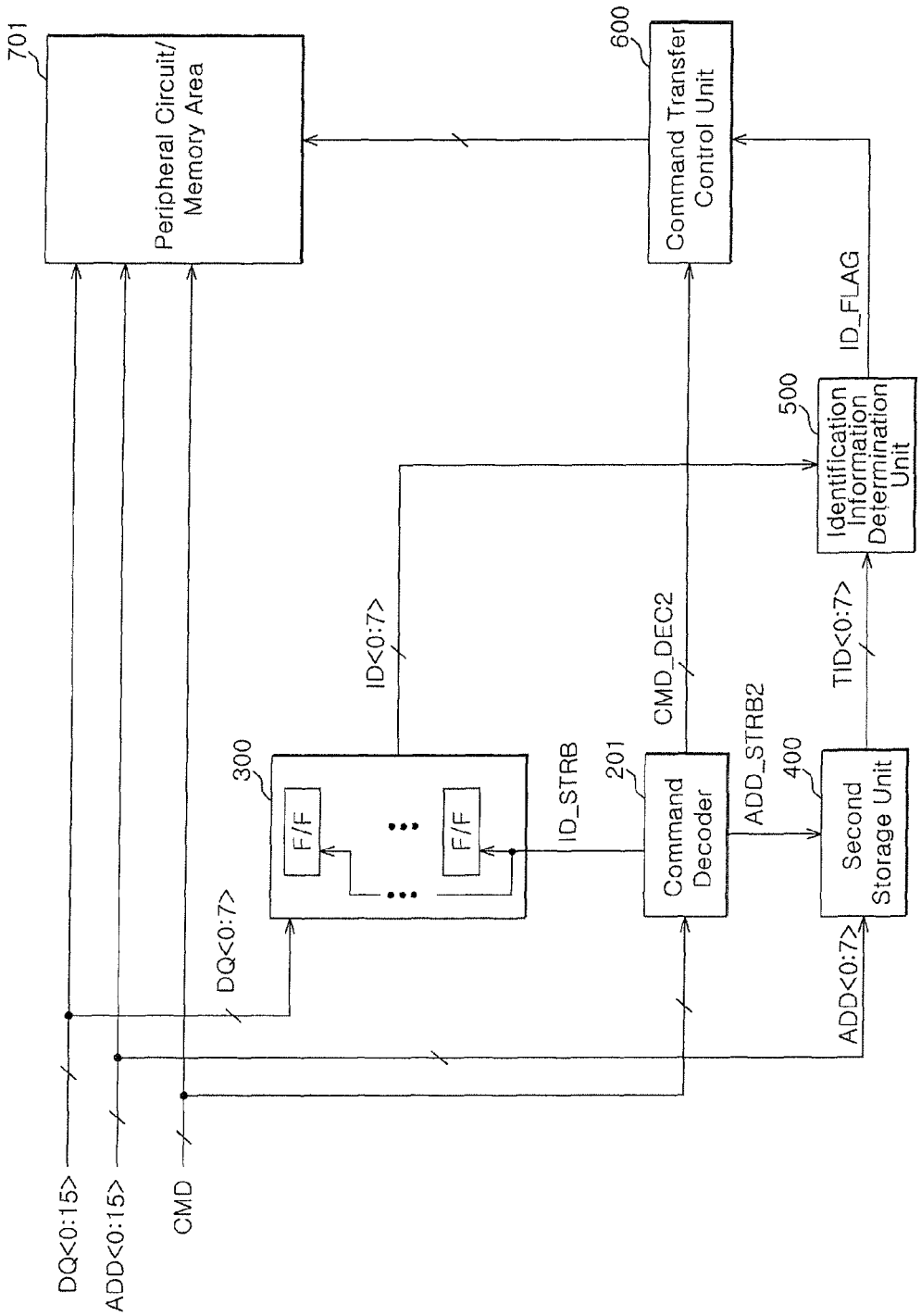
FIG. 7 is an exemplary internal block diagram for one of the memory chips shown in FIG. 6.

Referring to FIG. 7, memory chip 121 may be divided into a first circuit area and a second circuit area. First circuit area may include a peripheral circuit/memory area 701. Second circuit area may include a command decoder 201, a first storage unit 300, a second storage unit 400, an identification information determination unit 500, and a command transfer control unit 600.

Command decoder 201 is configured to generate a decoded command CMD_DEC2, a first strobe signal ID_STRB, and a second strobe signal ADD_STRB2. Decoded command CMD_DEC2 may be obtained by decoding a command provided by memory controller 111.

Decoded command CMD_DEC2 may include a command which uses only some of all bits of an address signal, for example, an auto-refresh operation AREF.

When the command is an identification information store command, command decoder 201 generates first strobe ID_STRB. When the command is a command which uses some of all bits of an address signal, command decoder 201 generates second strobe ADD_STRB2.

Peripheral circuit/memory area 701 is configured to directly receive general operation commands excluding decoded command CMD_DEC2 through command channel CMD, and receive decoded command CMD_DEC2 through command transfer control unit 600.

The other circuit components excluding command decoder 201 and peripheral circuit/memory area 701 may be configured in the same manner as illustrated in FIG. 3.

The series of operations in which unique identification information ID<0:7> is set in the respective memory chips 121 through 191 may be performed in an initialization operation interval of memory system 101. Then memory controller 111 provides a general operation command, for example, an auto-refresh operation AREF to the plurality of memory chips 121 through 191.

Furthermore memory controller 111 provides an address signal related to auto-refresh command AREF through address channels ADD<0:15> to the plurality of memory chips 121 through 191.

At this time, memory controller 111 transfers an address signal having the same value as target identification information TID through address channels ADD<0:7> which are not used by auto-refresh command AREF among address channels ADD<0:15>.

Command decoder 121 of each of memory chips 121 through 191 generates second strobe signal ADD_STRB2 in accordance with auto-refresh command AREF.

Second storage unit 400 stores the address signal transferred through address channel ADD<0:7> as target identification information TID<0:7> in response to second strobe signal ADD_STRB2.

Identification information determination unit 500 selects target identification information TID<0> corresponding to the same sequence as the unique identification information (for example, ID<0>) having a value of "0", and outputs the selected information as identification information confirm signal ID_FLAG.

Command transfer control unit 600 provides decoded command CMD_DEC2—i.e., auto-refresh command AREF—to peripheral circuit/memory area 701 in response to activated identification information confirm signal ID_FLAG.

Therefore, the memory chips in which identification information confirm signal ID_FLAG is activated, among the plurality of memory chips 121 through 191, perform an auto-refresh operation.

According to various embodiments of the present disclosure, the unique identification information is set in the plurality of semiconductor memories such that the plurality of semiconductor memories can selectively perform an operation command.

Furthermore, the selection of the semiconductor memories for specific operation commands and the performance of operation commands by the selected memories can be controlled at the same time.

Throughout the description, including in the claims, the term "comprising a" should be understood as being synonymous with the term "comprising at least one" unless otherwise specified to the contrary.

While certain embodiments have been described above, it will be understood to those skilled in the art that the embodiments described are by way of example only. Accordingly, the device and method described herein should not be limited based on the described embodiments. Rather, the apparatus described herein should only be limited in light of the claims that follow when taken in conjunction with the above description and accompanying drawings.

What is claimed is:

1. A memory system comprising:
a memory controller configured to generate an identification information store command, an identification information check command, a general operation command, an unique identification information, and a target identification information; and
a plurality of semiconductor memories configured to store the unique identification information in response to the identification information store command and to select one or more of the plurality of semiconductor memories simultaneously based on the target identification information and the unique identification information in response to the identification information check command,
wherein, the selected one or more of the plurality of semiconductor memories are configured to perform an operation corresponding to the general operation command,
wherein each semiconductor memory of the plurality of semiconductor memories comprises:
a first circuit area configured to perform the operation corresponding to the general operation command; and
a second circuit area configured to store the unique identification information and provide the general operation command to the first circuit area depending on whether or not the semiconductor memory is selected.

2. The memory system according to claim 1, wherein the memory controller is configured to provide the identification information store command and the unique identification information at an initialization interval of the memory system.

3. The semiconductor memory according to claim 1, wherein the first circuit area comprises a peripheral circuit and memory area.

4. The semiconductor memory according to claim 1, wherein the second circuit area is configured to receive the unique identification information through a data channel and receive the target identification information through an address channel.

5. The semiconductor memory according to claim 1, wherein the second circuit area comprises:
   a command decoder configured to generate a first strobe signal in response to the identification information store command, generate a second strobe signal in response to the identification information check command, and decode the general operation command;
   a first storage unit configured to store the unique identification information in response to the first strobe signal;
   a second storage unit configured to store the target identification information in response to the second strobe signal;
   an identification information determination unit configured to select one bit of the target identification information in accordance with the unique identification information, and output the selected bit as an identification information confirm signal; and
   a command transfer control unit configured to provide the general operation command to the first circuit area in response to the identification information confirm signal.

6. A method of controlling a memory system comprising a plurality of semiconductor memories, the method comprising:
   generating an identification information store command and allocating unique identification information to the plurality of semiconductor memories;
   generating an identification information check command to select one or more of the plurality of semiconductor memories simultaneously; and
   generating a general operation command and providing the general operation command in common to the plurality of semiconductor memories, after generating the identification information check command,
   wherein each semiconductor memory of the plurality of semiconductor memories comprises:
   a first circuit area configured to perform the operation corresponding to the general operation command; and
   a second circuit area configured to store the unique identification information and provide the general operation command to the first circuit area depending on whether or not the semiconductor memory is selected.

7. The method according to claim 6, wherein allocating the unique identification information comprises transferring the unique identification information to the plurality of semiconductor memories through data channels which are individually connected to the respective semiconductor memories.

8. The method according to claim 6, wherein selecting one or more of the semiconductor memories comprises:
   transferring target identification information to the plurality of semiconductor memories through an address channel connected in common to the plurality of semiconductor memories; and
   at each of the semiconductor memories, checking whether or not the unique identification information is designated in the target identification information.

9. A memory system comprising:
   a plurality of semiconductor memories configured to be allocated unique identification information and, wherein the selected one or more of the plurality of semiconductor memories are configured to perform an operation in response to a general operation command,
   wherein each semiconductor memory of the plurality of semiconductor memory comprises:
   a first circuit area configured to perform the operation corresponding to the general operation command; and
   a second circuit area configured to store the unique identification information and provide the general operation command to the first circuit area depending on whether or not the semiconductor memory is selected; and
   a memory controller configured to allocate the unique identification information to the plurality of semiconductor memories, to select the one or more of the plurality of semiconductor memories simultaneously, and to supply the general operation command to the plurality of semiconductor memories.

10. The memory system according to claim 9, wherein the memory controller is configured to provide the unique identification information at an initialization interval of the memory system.

11. The semiconductor memory according to claim 9, wherein the first circuit area comprises a peripheral circuit and memory area.

12. The semiconductor memory according to claim 9, wherein the second circuit area is configured to receive the unique identification information through a data channel.

13. The semiconductor memory according to claim 9, wherein the second circuit area comprises:
   a command decoder configured to generate a first strobe signal in response to an identification information store command from the memory controller, generate a second strobe signal in response to an identification information check command from the memory controller, and decode the general operation command;
   a first storage unit configured to store the unique identification information in response to the first strobe signal;
   a second storage unit configured to store a target identification information from the memory controller in response to the second strobe signal;
   an identification information determination unit configured to select one bit of the target identification information in accordance with the unique identification information, and output the selected bit as an identification information confirm signal; and
   a command transfer control unit configured to provide the general operation command to the first circuit area in response to the identification information confirm signal.

* * * * *